(12) United States Patent
Sugahara et al.

(10) Patent No.: US 7,919,904 B2
(45) Date of Patent: Apr. 5, 2011

(54) METHOD FOR PRODUCING PIEZOELECTRIC ACTUATOR, METHOD FOR PRODUCING LIQUID DROPLET JETTING APPARATUS, PIEZOELECTRIC ACTUATOR, AND LIQUID DROPLET JETTING APPARATUS

(75) Inventors: Hiroto Sugahara, Aichi-ken (JP); Motohiro Yasui, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 472 days.

(21) Appl. No.: 11/717,349

(22) Filed: Mar. 13, 2007

(65) Prior Publication Data
US 2007/0216258 A1    Sep. 20, 2007

(30) Foreign Application Priority Data

Mar. 20, 2006    (JP) .................................. 2006-075943

(51) Int. Cl.
    *H01L 41/08*    (2006.01)
(52) U.S. Cl. ........................ 310/331; 310/324; 347/68
(58) Field of Classification Search ........... 310/330–332
    See application file for complete search history.

(56) References Cited

U.S. PATENT DOCUMENTS

| | | | | |
|---|---|---|---|---|
| 5,475,279 | A * | 12/1995 | Takeuchi et al. | 310/331 |
| 5,512,793 | A * | 4/1996 | Takeuchi et al. | 310/328 |
| 5,594,292 | A * | 1/1997 | Takeuchi et al. | 310/324 |
| 7,512,035 | B2 * | 3/2009 | Sugahara | 367/70 |
| 7,559,128 | B2 * | 7/2009 | Kitagawa et al. | 29/25.35 |
| 7,591,542 | B2 * | 9/2009 | Sugahara | 347/68 |
| 2005/0068378 | A1 | 3/2005 | Sanada | |
| 2006/0010687 | A1 | 1/2006 | Yasui | |
| 2006/0012644 | A1 | 1/2006 | Yasui | |
| 2007/0216234 | A1 | 9/2007 | Sugahara et al. | |

FOREIGN PATENT DOCUMENTS

| | | |
|---|---|---|
| EP | 1 617 491 | 1/2006 |
| EP | 1 837 180 | 9/2007 |
| JP | 2004-122341 | 4/2004 |
| JP | 2005-154803 | 6/2005 |

* cited by examiner

*Primary Examiner* — Mark Budd
(74) *Attorney, Agent, or Firm* — Frommer Lawrence & Haug LLP

(57) ABSTRACT

A film-forming nozzle is moved so that a boundary portion of a plurality of areas on which a piezoelectric material layer is formed by a film-forming nozzle moving relative to a vibration plate is positioned outside deformable portions of the vibration plate and overlaps with restricted portions. This reduces stress concentration on a portion of the piezoelectric layer corresponding to the boundary portion of the deposition areas, and therefore, damage of the piezoelectric material layer is prevented.

7 Claims, 14 Drawing Sheets

SCANNING DIRECTION

PAPER FEEDING DIRECTION

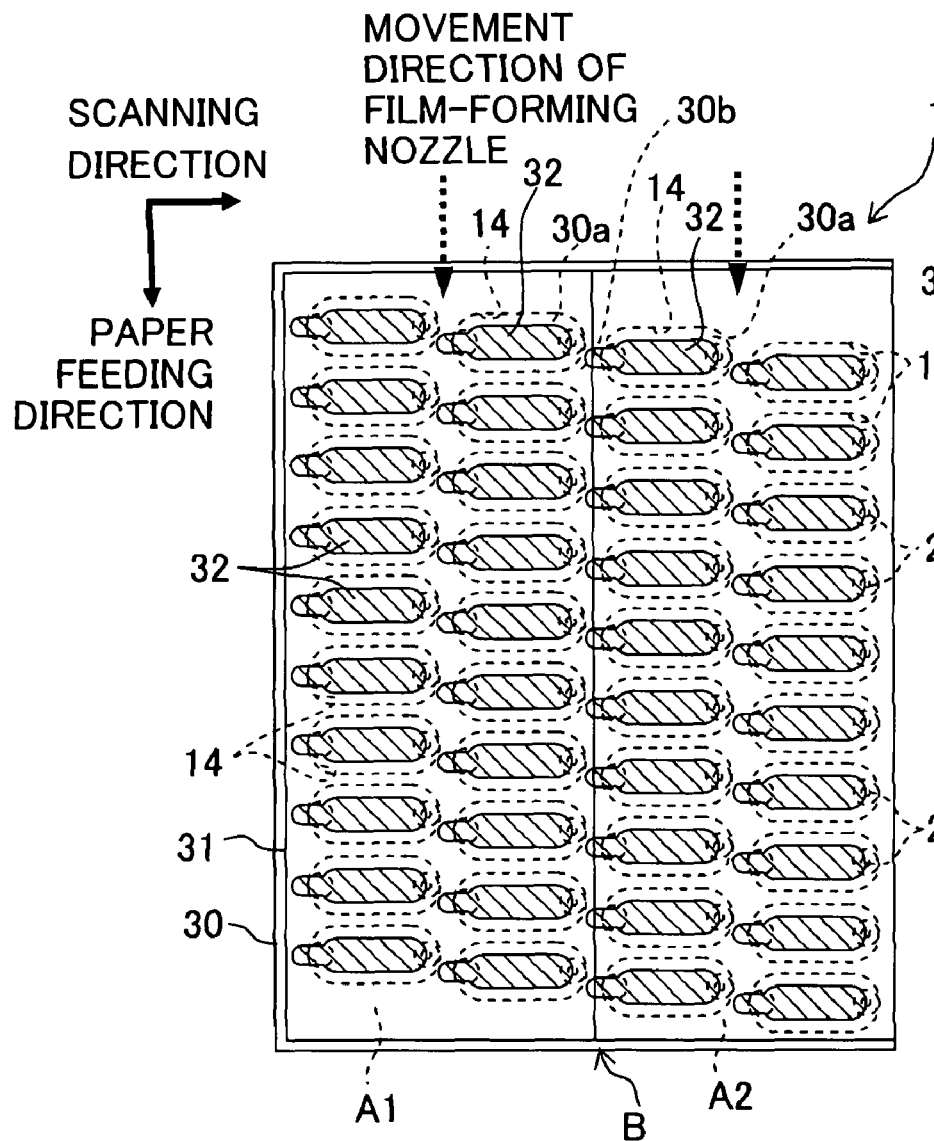
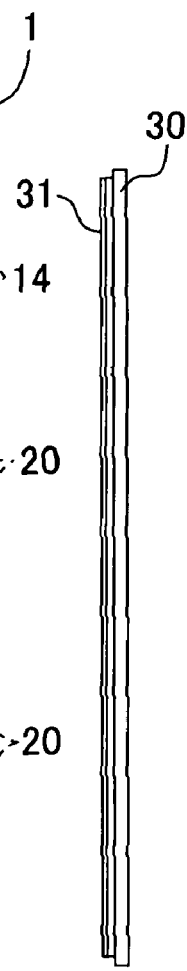
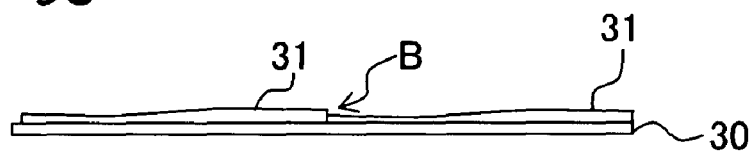

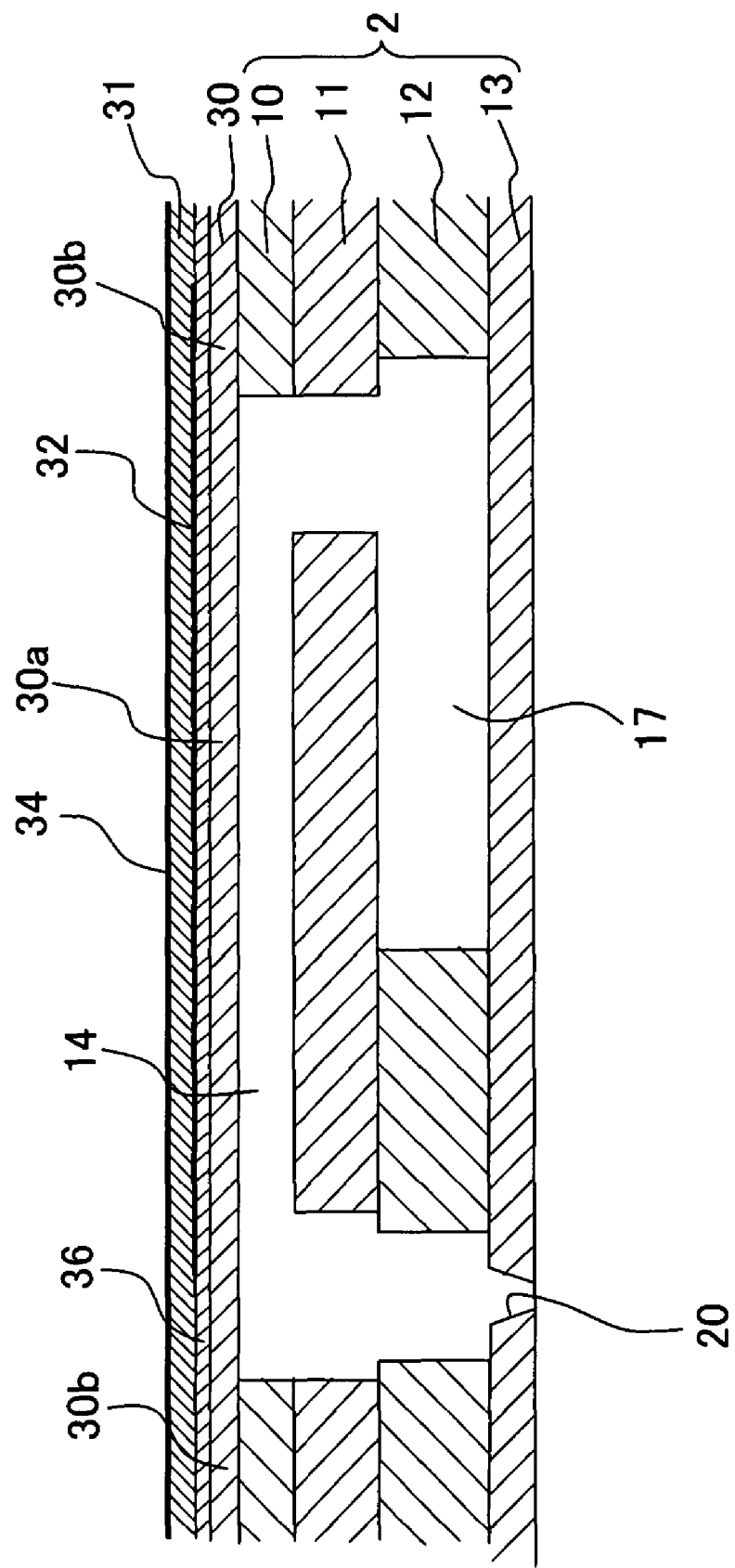

METHOD FOR PRODUCING PIEZOELECTRIC ACTUATOR, METHOD FOR PRODUCING LIQUID DROPLET JETTING APPARATUS, PIEZOELECTRIC ACTUATOR, AND LIQUID DROPLET JETTING APPARATUS

CROSS REFERENCE TO RELATED APPLICATION

The present application claims priority from Japanese Patent Application No. 2006-075943, filed on Mar. 20, 2006, the disclosure of which is incorporated herein by reference in its entirety.

BACKGROUND OF THE INVENTION

1. Field of the Invention

The present invention relates to a method for producing a piezoelectric actuator, a method for producing a liquid droplet jetting apparatus, a piezoelectric actuator, and a liquid droplet jetting apparatus.

2. Description of the Related Art

There has been conventionally known a piezoelectric actuator which includes: a substrate made of a metal material or the like; a piezoelectric material layer in a thin film form made of a ferroelectric, piezoelectric ceramic material such as PZT (lead zirconate titanate); and an electrode to generate an electric field in the piezoelectric material layer. This piezoelectric actuator utilizes the expansion/contraction of the piezoelectric material layer caused by the action of the electric field to deform the substrate, thereby driving a driven object.

As one method for forming a thin film on a flat surface of a substrate, there has been known an aerosol deposition method (hereinafter, referred to as an AD method) in which aerosol containing a thin film material in a fine particle form and carrier gas is jetted from a film-forming nozzle to the substrate, and by collision energy at this time, the particles are deposited on the surface of the substrate to form the film. Japanese Patent Application Laid-open No. 2004-122341 discloses a method for forming a piezoelectric material layer in a thin film form on a surface of a substrate by using the AD method. According to this film-forming method, while a film-forming nozzle having a slit is moved relative to the substrate, aerosol containing particles of a piezoelectric material and carrier gas is jetted from the slit to the substrate and the particles of the piezoelectric material are deposited on the substrate, thereby forming the piezoelectric material layer on the substrate.

SUMMARY OF THE INVENTION

The most typical method for forming a thin film layer on a substrate by the AD method is to jet aerosol while moving a film-forming nozzle in a predetermined direction (scanning direction) relative to the substrate, but in this case, the band-shaped thin film layer formed on the substrate easily has thickness distribution in a width direction which is a direction orthogonal to the scanning direction (see FIG. 10 of Japanese Patent Application Laid-open No. 2004-122341). A first reason for this is that the deposition speed of the particles varies due to nonuniform velocity distribution of the aerosol jetted from the slit. Another reason is that the aerosol jetted at a predetermined angle from the slit shaves off part of the film previously formed on the substrate, resulting in a delayed deposition of the particles on this area.

Therefore, when the piezoelectric material layer is formed by the AD method, the formed piezoelectric material layer easily has the thickness distribution in the direction orthogonal to the movement direction of the film-forming nozzle. This thickness distribution sometimes causes a trouble to the piezoelectric actuator.

It is an object of the present invention to provide a piezoelectric actuator whose breakage can be prevented as much as possible even if a thin film layer thereof formed by a film-forming step using the AD method has a portion in which the thickness changes sharply, by reducing stress concentration on this portion, and a method for producing the same.

According to a first aspect of the present invention, there is provided a method for producing a piezoelectric actuator which includes a substrate having a plurality of deformable portions and restricted portions defining the deformable portions; and a plurality of thin film layers which are disposed on the substrate and which is provided with driving electrodes arranged to overlap with the deformable portions and a piezoelectric material layer, the method including:

a step for providing the substrate; and a step for forming the thin film layers on the substrate, wherein the step for forming the thin film layers includes forming at least one thin film layer among the thin film layers on a plurality of defined areas defined and adjacent to each other on the substrate, by jetting, to the areas, aerosol which contains particles forming the at least one thin film layer and carrier gas from a film-forming nozzle while moving the film-forming nozzle relative to the areas so that a boundary portion of the adjacent areas is positioned outside the deformable portions.

When a film-forming nozzle jets aerosol while moving in a certain direction relative to a substrate to form a thin film layer on the substrate, the formed thin film layer easily has thickness distribution in a direction orthogonal to the movement direction of the film-forming nozzle. Therefore, when the film-forming nozzle is moved relative to a plurality of adjacent areas on the substrate to form a thin film layer on these areas, thickness distribution on the film-formed areas, if any, easily causes a sharp thickness change in the thin film layer at a portion where the deposition areas are adjacent to each other (boundary portion). Therefore, in a case where the thin film layer is, for example, a piezoelectric material layer, when the piezoelectric material layer is deformed by the application of an electric field at the time of polarization processing in a producing stage or at the time when the piezoelectric actuator drives a driven object, especially large stress concentration easily occurs on the boundary portion where the thickness sharply changes. The inventor has found out that this stress concentration can be a factor to cause a crack in the boundary portion to break the piezoelectric material layer.

According to the method for producing the piezoelectric actuator of the present invention, the boundary portion of the areas of at least one of the thin film layers of the piezoelectric actuator is positioned outside areas where the driving electrodes and the deformable portions of the substrate overlap with each other, that is, areas (active portions) where the electric field is directly applied to the piezoelectric material layer by the driving electrodes to greatly deform the substrate, and does not overlap with these areas. Consequently, even in a case where the thin film layer has a sharp thickness change at the boundary portion of the film-formed areas, the stress concentration on this portion is small and the breakage of the thin film layer is prevented, resulting in enhanced reliability of the piezoelectric actuator.

In the method for producing the piezoelectric actuator of the present invention, a slit from which the aerosol is jetted may be formed in the film-forming nozzle, and the slit may have a size to an extent that a jetting area formed of the aerosol jetted to the substrate covers at least one of the pressure chambers. The use of the slit with such a size makes it possible to position the boundary portion of the film-formed areas outside the active portions when the film is formed.

In the method for producing the piezoelectric actuator of the present invention, any of the deformable portions may be formed within one of the defined areas.

In the method for producing the piezoelectric actuator of the present invention, in the step for forming the thin film layers, the film-forming nozzle may be moved relative to each of the areas to make the boundary portion overlap with the restricted portions as viewed from a direction orthogonal to the substrate. According to this producing method, the boundary portion of the areas on which the thin film is formed by the film-forming nozzle moving relative to the substrate overlaps with the restricted portions of the substrate and does not overlap with the deformable portions, and therefore, even if the thin film layer has a sharp thickness change in the boundary portion of the film-formed areas, stress concentration occurring on this portion is small.

In the method for producing the piezoelectric actuator of the present invention, the substrate may have a deformable portion row in which the deformable portions are aligned in a predetermined direction; and in the step for forming the thin film layers, the at least one thin film layer may be formed at one time entirely on an area overlapping with the deformable portion row as viewed from the direction orthogonal to the substrate, by moving the film-forming nozzle relative to the substrate in the predetermined direction. According to this producing method, there is no area where the boundary portion of the film-formed areas of the thin film layer overlaps with the deformable portions, and stress concentration on this portion is small. Incidentally, to form the thin film layer on an area overlapping with one row of the deformable portions, this producing method includes both a method for moving the film-forming nozzle only once and a method for moving the film-forming nozzle relative to one deposition area a plurality of times to deposit the particles in multiple layers on the deposition area.

In the method for producing the piezoelectric actuator of the present invention, in the step for forming the thin film layers, the piezoelectric material layer may be formed by jetting aerosol which contains particles of a piezoelectric material and carrier gas, from the film-forming nozzle to the substrate. According to this producing method, it is possible to reduce stress concentration occurring on a portion of the piezoelectric material layer corresponding to the boundary portion of the film-formed areas, which can prevent the breakage of the piezoelectric material layer.

In the method for producing the piezoelectric actuator of the present invention, the substrate may be electroconductive; the thin film layers may include an insulation layer; and in the step for forming the thin film layers, the insulation layer insulating the substrate and the driving electrodes from each other may be formed by jetting aerosol which contains particles of an insulative material and carrier gas from the film-forming nozzle to the substrate. According to this producing method, it is possible to reduce stress concentration occurring on a portion of the insulation layer corresponding to the boundary portion of the film-formed areas, which can prevent the damage of the insulation layer.

According to a second aspect of the present invention, there is provided a method for producing a liquid droplet jetting apparatus including a channel unit having a plurality of pressure chambers arranged along a plane, and a plurality of jetting nozzles communicating with the pressure chambers respectively; and a piezoelectric actuator having a substrate which is disposed on one surface of the channel unit to cover the pressure chambers and which includes deformable portions facing the pressure chambers, restricted portions at which the piezoelectric actuator is joined to the channel unit, and a plurality of thin film layers disposed on the substrate and including a piezoelectric material layer and driving electrodes arranged on one surface of the piezoelectric material layer, and the driving electrodes being partially overlapping with one of the deformable portions, the method including:

a step for forming the thin film layers on the substrate; and a step for providing the channel unit on the substrate, wherein the step for forming the thin film layers includes forming at least one thin film layer among the thin film layers on a plurality of adjacent sectional areas on the substrate, by jetting, to the areas, aerosol which contains particles forming the at least one thin film layer and carrier gas from a film-forming nozzle while moving the film-forming nozzle relative to the areas so that a boundary portion of the adjacent areas is positioned outside the deformable portions.

According to this method for producing the liquid droplet jetting apparatus, the boundary portion of the areas of at least one of the thin film layers of the piezoelectric actuator is positioned outside areas where the driving electrodes and the deformable portions of the substrate overlap with each other, that is, areas where an electric field is directly applied to the piezoelectric material layer by the driving electrodes to greatly deform the substrate. Consequently, even in a case where the thin film layer has a sharp thickness change at the boundary portion of the film-formed areas, stress concentration on this portion is small and the breakage of the thin film layer is prevented.

In the method for producing the liquid droplet jetting apparatus of the present invention, a slit from which the aerosol is jetted may be formed in the film-forming nozzle, and the slit may have a size to an extent that a jetting area formed of the aerosol jetted to the substrate covers at least one of the pressure chambers. The use of the slit with such a size makes it possible to position the boundary portion of the film-formed areas outside the active portions when the film is formed.

In the method for producing the liquid droplet jetting apparatus of the present invention, any of the deformable portions may be formed within one of the defined areas on the substrate.

In the method for producing the liquid droplet jetting apparatus of the present invention, in the step for forming the thin film layers, the film-forming nozzle may be moved relative to each of the areas to make the boundary portion overlap with the restricted portions as viewed from a direction orthogonal to the substrate. According to this producing method, the boundary portion of the areas on which the thin film is formed by the film-forming nozzle moving relative to the substrate overlaps with the restricted portions of the substrate and does not overlap with the deformable portions, and therefore, even if the thin film layer has a sharp thickness change in the boundary portion of the film-formed areas, stress concentration occurring on this portion is small.

In the method for producing the liquid droplet jetting apparatus of the present invention, the substrate may have a deformable portion row in which the deformable portions are aligned in a predetermined direction; and in the step for forming the thin film layers, the film may be formed at one time entirely on an area, overlapping with the deformable portion row as viewed from the direction orthogonal to the substrate, by moving the film-forming nozzle relative to the substrate in the predetermined direction. According to this producing method, there is no area where the boundary portion of the film-formed areas of the thin film layer overlaps with the deformable portions, and stress concentration on this portion is small. Incidentally, to form the thin film layer on an area overlapping with one row of the deformable portions, this producing method includes both a method for moving the film-forming nozzle only once and a method for moving the film-forming nozzle relative to one deposition area a plurality of times to deposit the particles in multiple layers on the film-formed area.

In the method for producing the liquid droplet jetting apparatus of the present invention, the at least one thin film layer may be the piezoelectric material layer. According to this producing method, it is possible to reduce stress concentration occurring on a portion of the piezoelectric material layer corresponding to the boundary portion of the film-formed areas, which can prevent the breakage of the piezoelectric material layer.

In the method for producing the liquid droplet jetting apparatus of the present invention, the at least one thin film layer may be an insulation layer. According to this producing method, it is possible to reduce stress concentration occurring on a portion of the insulation layer corresponding to the boundary portion of the deposition areas, which can prevent the damage of the insulation layer.

According to a third aspect of the present invention, there is provided a piezoelectric actuator, including:

a substrate having a plurality of deformable portions and restricted portions defining the deformable portions; and a plurality of thin film layers which are disposed on the substrate and which include a piezoelectric material layer and driving electrodes arranged on one surface of the piezoelectric material layer, each of the driving electrodes overlapping at least partially with one of the deformable portions, wherein at least one thin film layer among the thin film layers has a plurality of areas adjacent to each other, and a boundary portion of the adjacent areas is positioned outside the deformable portions.

According to this piezoelectric actuator, in at least one of the thin film layers, the boundary portion of the areas on which the film is formed by the film-forming nozzle moving relative to the substrate is positioned outside areas where the driving electrodes and the deformable portions of the substrate overlap with each other, that is, areas where an electric field is directly applied to the piezoelectric material layer by the driving electrodes to greatly deform the substrate. Consequently, even in a case where the thin film layer has a sharp thickness change at the boundary portion of the film-formed areas, stress concentration on this portion is small and the breakage of the thin film layer is prevented.

In the piezoelectric actuator of the present invention, the at least one thin film layer may be the piezoelectric material layer.

In the piezoelectric actuator of the present invention, the at least one thin film layer may be formed on each of the defined areas adjacent on the substrate by jetting, to the areas, aerosol which contains particles forming the at least one thin film layer and carrier gas from a film-forming nozzle while moving the film-forming nozzle relative to each of the defined areas so that a boundary portion of the adjacent areas is positioned outside the deformable portions.

According to a fourth aspect of the present invention, there is provided a liquid droplet jetting apparatus, including:

a channel unit having a plurality of pressure chambers arranged along a plane and a plurality of jetting nozzles communicating with the pressure chambers respectively; and a piezoelectric actuator including: a substrate which is disposed on one surface of the channel unit to cover the pressure chambers, and which has deformable portions facing the pressure chambers and restricted portions, at which the piezoelectric actuator is joined to the channel unit; and a plurality of thin film layers which are disposed on the substrate, and which include a piezoelectric material layer and driving electrodes, the driving electrodes being arranged on one surface of the piezoelectric material layer to overlap with the deformable portions respectively, wherein at least one thin film layer among the thin film layers of the piezoelectric actuator has a plurality of areas adjacent to each other, and a boundary portion of the adjacent areas is positioned outside the deformable portions.

According to this liquid droplet jetting apparatus, in at least one of the thin film layers of the piezoelectric actuator, the boundary portion of the areas on which the film is formed by the film-forming nozzle moving relative to the substrate is positioned outside areas where the driving electrodes and the deformable portions of the substrate overlap with each other, that is, areas where an electric field is directly applied to the piezoelectric material layer by the driving electrodes to greatly deform the substrate. Consequently, even in a case where the thin film layer has a sharp thickness change at the boundary portion of the film-formed areas, stress concentration on this portion is small and the breakage of the thin film layer is prevented.

In the liquid droplet jetting apparatus of the present invention, the at least one thin film layer may be the piezoelectric material layer.

In the liquid droplet jetting apparatus of the present invention, at least one thin film layer may be formed on the adjacent areas on the substrate, by jetting, to the areas, aerosol which contains particles forming the at least one thin film layer and carrier gas from a film-forming nozzle while moving the film-forming nozzle relative to each of the adjacent areas so that a boundary portion of the adjacent areas is positioned outside the deformable portions.

In the liquid droplet jetting apparatus of the present invention, the liquid droplet jetting apparatus may be an ink-jet printer.

BRIEF DESCRIPTION OF THE DRAWINGS

FIG. 9A is a plan view of an ink-jet head;

FIG. 9B is a side view of a piezoelectric actuator seen from a scanning direction;

FIG. 9C is a side view of the piezoelectric actuator seen from a paper feeding direction;

FIG. 14 is a cross-sectional view, corresponding to FIG. 4, of an ink-jet head of a fourth modified embodiment.

DETAILED DESCRIPTION OF THE PREFERRED EMBODIMENTS

Next, an embodiment of the present invention will be explained. This embodiment is an example where the present invention is applied to a serial-type ink-jet head which records an image or the like by jetting an ink to a recording paper while moving in one direction.

Figure 1:
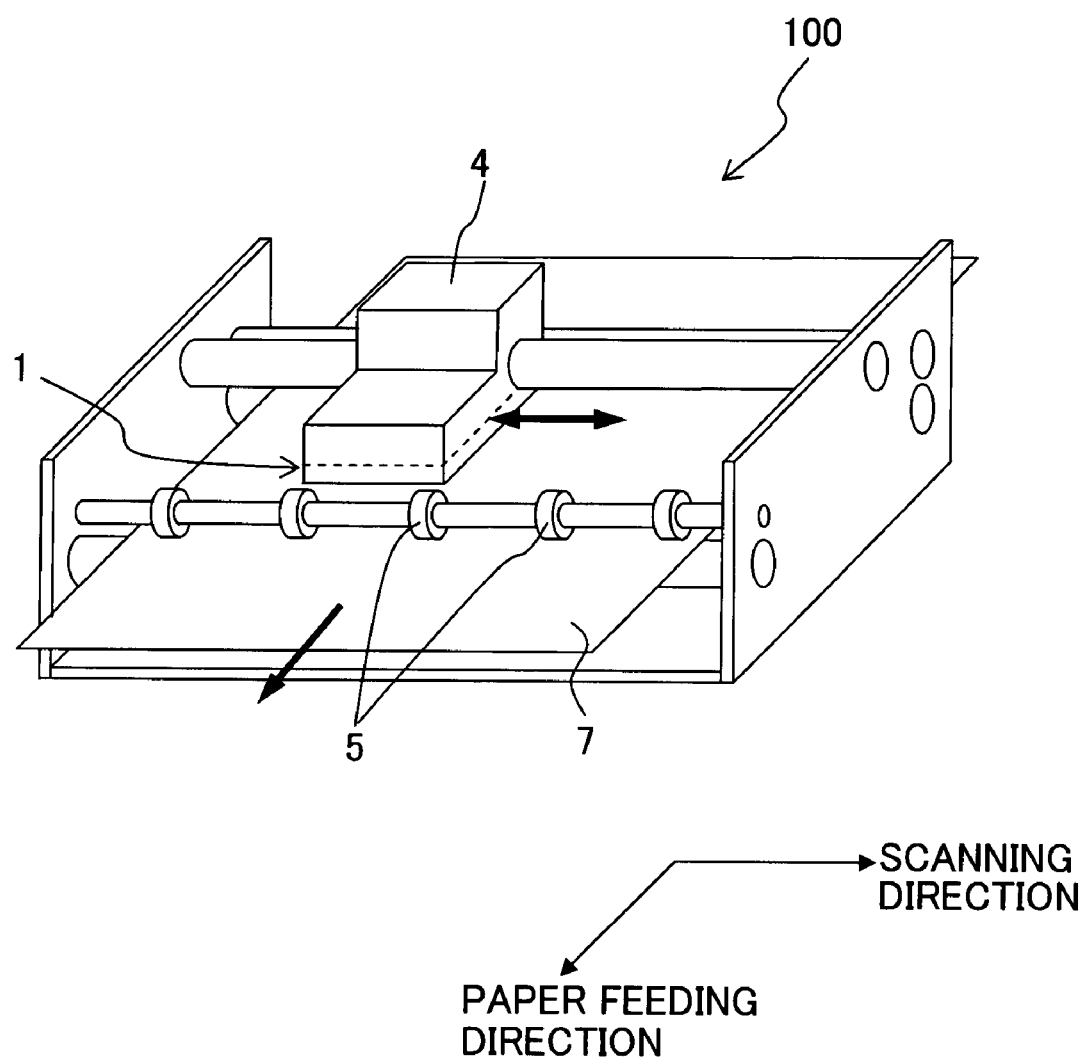
FIG. 1 is a schematic structural view of an ink-jet printer according to an embodiment of the present invention.

First, the structure of an ink-jet printer including the serial-type ink-jet head will be briefly explained. As shown in FIG. 1, an ink-jet printer 100 includes: a carriage 4 movable in a right and left direction in FIG. 1; a serial-type ink-jet head 1 (liquid droplet jetting apparatus) provided in the carriage 4 to jet ink droplets to a recording paper 7; a transporting rollers 5 sending the recording paper 7 in a forward direction in FIG. 1; and so on. The ink-jet printer 100 records desired characters, images, and the like on the recording paper 7 by jetting the ink onto the recording paper 7 from jetting nozzles 20 (see FIG. 2 to FIG. 5) formed on a lower surface of the ink-jet head 1 while integrally moving the ink-jet head 1 by the carriage 4 in the right and left direction (scanning direction).

Next, the ink-jet head 1 will be explained with reference to FIG. 2 to FIG. 5. The ink-jet head 1 includes: a channel unit 2 in which ink channels including the jetting nozzles 20 and pressure chambers 14 are formed; and a piezoelectric actuator 3 which is arranged on an upper surface of the channel unit 2 to apply a jetting pressure to an ink in each of the pressure chambers 14.

Figure 4:
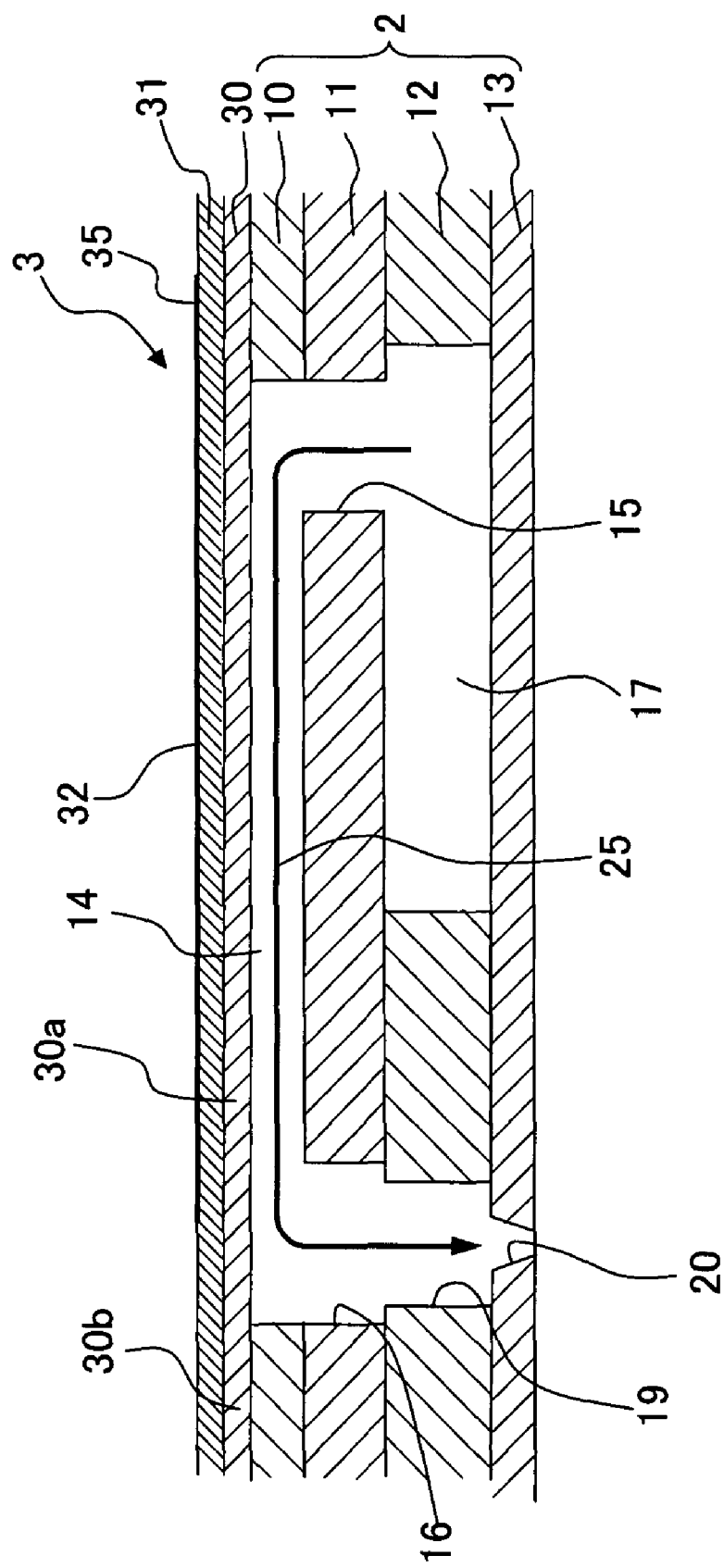
FIG. 4 is a cross-sectional view taken along line IV-IV in FIG. 3.
Figure 5:
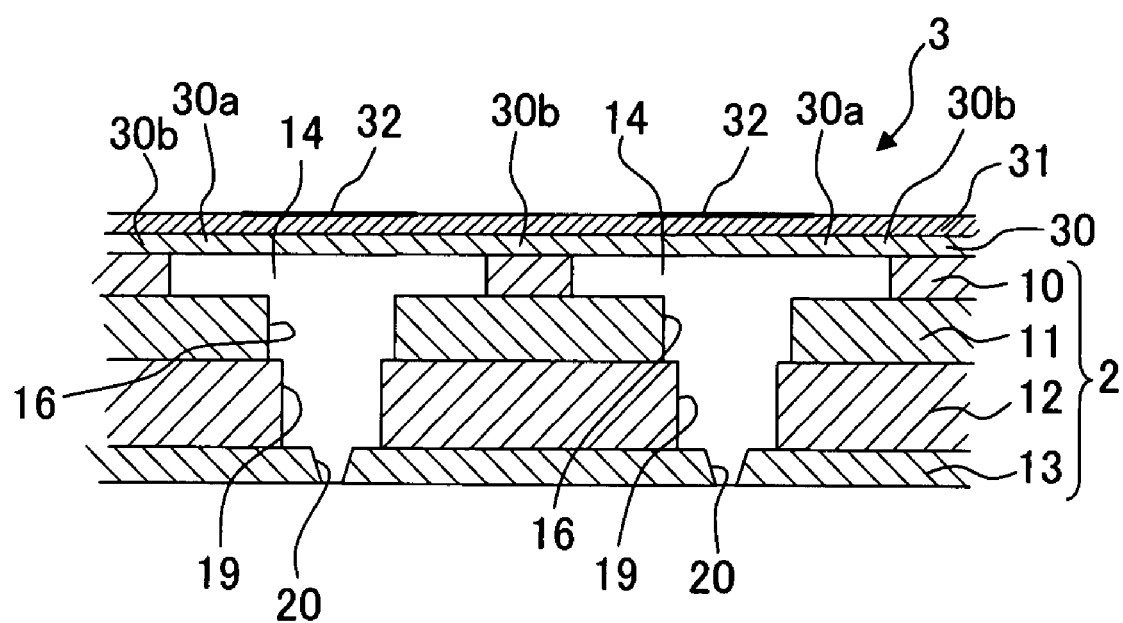
FIG. 5 is a cross-sectional view taken along line V-V in FIG. 3.

First, the channel unit 2 will be explained. As shown in FIG. 4 and FIG. 5, the channel unit 2 includes a cavity plate 10, a base plate 11, a manifold plate 12, and a nozzle plate 13, and these four plates 10 to 13 are joined together in a stacked state. Among these plates, the cavity plate 10, the base plate 11, and the manifold plate 12 are stainless steel plates, and the ink channels such as manifolds 17 (to be described later) and the pressure chambers 14 can be easily formed in these three plates 10 to 12 by etching. Further, the nozzle plate 13 may be formed of a high-molecular synthetic resin material such as, for example, polyimide and is joined on a lower surface of the manifold plate 12. Alternatively, this nozzle plate 13 may also be formed of a metal material such as stainless steel similarly to the three plates 10 to 12.

As shown in FIG. 2 to FIG. 5, in the upper most cavity plate 10 among the four plates 10 to 13, the pressure chambers 14 arranged along a plane are formed by holes penetrating the plate 10, and these pressure chambers 14 are covered by a vibration plate 30 (to be described later) and the base plate 11 from upper and lower sides. Further, the pressure chambers 14 are arranged in a paper feeding direction (up and down direction in FIG. 2) to form four rows. Further, each of the pressure chambers 14 has a substantially elliptical form which is long in the scanning direction (right and left direction in FIG. 2) in a plan view. Incidentally, "in a plan view" in the present invention is a view seen from a direction orthogonal to the vibration plate (substrate) 30.

Figure 2:
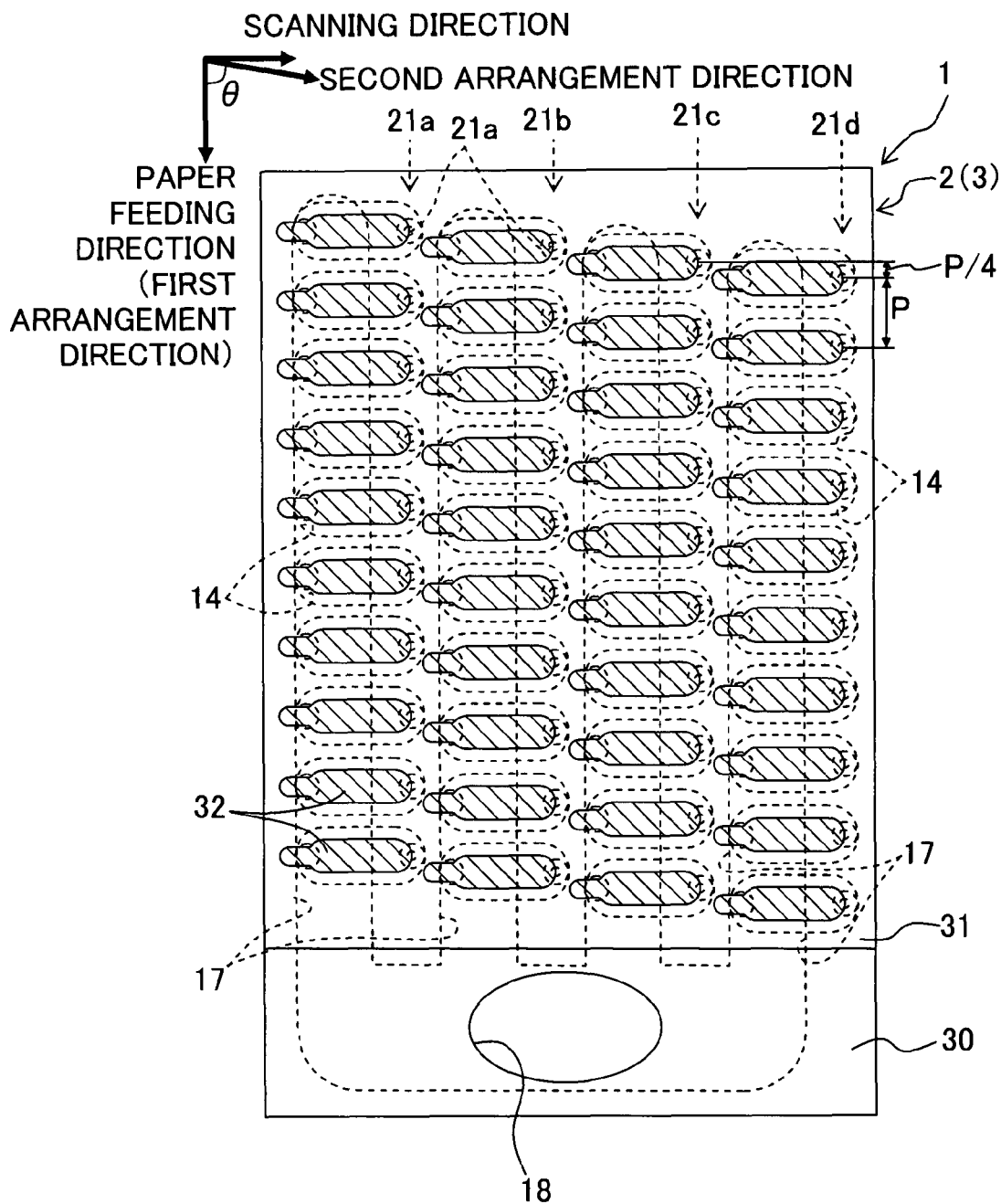
FIG. 2 is a plan view of an ink-jet head.
Figure 3:
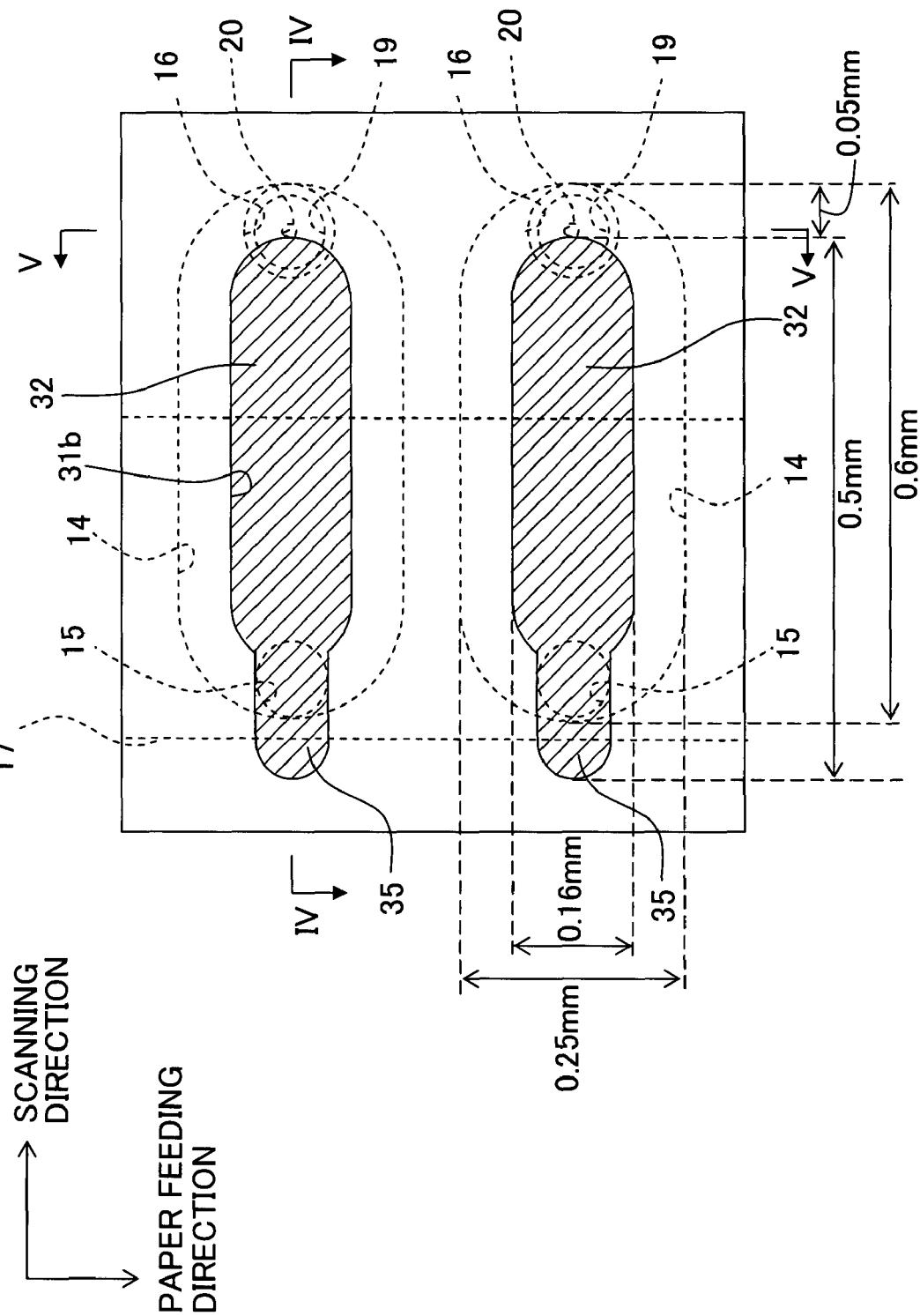
FIG. 3 is a partial enlarged view of FIG. 2.

As shown in FIG. 3, in the base plate 11, communication holes 15, 16 are formed at positions overlapping with both end portions of the pressure chambers 14 in a plan view, respectively. In this example, the radius of each of the communication holes 15, 16 is about 0.05 mm. Further, in the manifold plate 12, four manifolds 17 extending in the paper feeding direction (up and down direction in FIG. 2) are formed to overlap with portions on a side of communication hole 15 of the pressure chambers 14 arranged in the paper feeding direction, in a plan view. These four manifolds 17 communicate with an ink supply port 18 (see FIG. 2) formed in the vibration plate 30 which will be described later, and the ink is supplied to the manifolds 17 via the ink supply port 18 from ink tanks (not shown). In the manifold plate 12, a plurality of communication holes 19 communicating with the communication holes 16 are also formed at positions overlapping with end portions of the pressure chambers 14 on a side opposite to the manifolds 17 in a plan view.

Further, in the nozzle plate 13, the jetting nozzles 20 are formed at positions overlapping with the communication holes 19 in a plan view. As shown in FIG. 2, the jetting nozzles 20 overlap with the end portions of the pressure chambers 14 arranged in four rows, on a side opposite to the manifolds 17, and are arranged in the paper feeding direction (up and down direction in FIG. 2) at an equal spacing distance in areas not overlapping with the four manifolds 17 to form four nozzle rows 21a, 21b, 21c, 21d arranged in the scanning direction. These four nozzle rows 21a to 21d are composed of the same number of the jetting nozzles 20, and in these nozzle rows 21a to 21d, spacing distances (pitches P) between the jetting nozzles 20 in the arrangement direction are all equal. Further, the four nozzle rows 21a to 21d are shifted in sequence by P/4 toward a downstream side of the paper feeding direction (downward in FIG. 2). Therefore, with the four nozzle rows 21a to 21d, it is possible to form, on the recording paper 7, a plurality of dots arranged at a spacing distance of P/4 in the paper feeding direction.

Incidentally, the jetting nozzles 20 and the pressure chambers 14 corresponding to the jetting nozzles 20 are arranged not only in the paper feeding direction (first arrangement direction) but also in a direction intersecting with the paper feeding direction at an angle θ (second arrangement direction), and are consequently arranged in a matrix form along these two directions. Note that the number of the jetting nozzles 20 and the pressure chambers 14 arranged in the first arrangement direction (ten) is larger than the number of the jetting nozzles 20 and the pressure chambers 14 arranged in the second arrangement direction (four), and the spacing distance in the first arrangement direction is smaller (arrangement density is higher). That is, the first arrangement direction corresponds to a direction in which rows of dots are formed on the recording paper 7 with higher definition.

As shown in FIG. 4, the manifolds 17 communicate with the pressure chambers 14 via the communication holes 15, and the pressure chambers 14 further communicate with the jetting nozzles 20 via the communication holes 16, 19. In this manner, in the channel unit 2, the individual ink channels 25 are formed in plurality, each extending from the manifold 17 to the jetting nozzle 20 via the pressure chamber 14.

Next, the piezoelectric actuator 3 will be explained. As shown in FIG. 2 to FIG. 5, the piezoelectric actuator 3 has: the metal vibration plate 30 (substrate) arranged on the upper surface of the channel unit 2; a piezoelectric material layer 31 continuously formed on an upper surface of the vibration plate 30 to cover the pressure chambers 14; and a plurality of individual electrodes 32 (driving electrodes) formed on an upper surface of the piezoelectric material layer 31 so as to correspond to the pressure chambers 14 respectively. The piezoelectric material layer 31 and the individual electrodes 32 are both layers in a thin film form (thin film layers) with a thickness of about several µm to about ten-odd µm. As shown in FIG. 3, the width of each of the individual electrodes 32 (length in the paper feeding direction in FIG. 3) may be about 0.16 mm.

The vibration plate 30 is a conductive plate made of a metal material and having a substantially rectangular form in a plan view. The vibration plate 30 is made of, for example, an iron alloy such as stainless steel, a copper alloy, a nickel alloy, a titanium alloy, or the like. The vibration plate 30 is arranged on an upper surface of the cavity plate 10 to cover the pressure chambers 14 and is joined to the cavity plate 10. Portions, of the vibration plate 30, facing the pressure chambers 14 are deformable portions 30a which are bendingly deformable in the up and down direction, while portions, of the vibration plate 30, joined to the cavity plate 10 are restricted portions 30b whose deformation is restricted. The vibration plate 30 is constantly kept at a ground potential and faces the individual electrodes 32, so that the vibration plate 30 also serves as a common electrode which causes an electric field in a thickness direction to act on the piezoelectric material layer 31 which is sandwiched between the individual electrodes 32 and the vibration plate 30.

On the upper surface of the vibration plate 30, the piezoelectric material layer 31 is formed. The piezoelectric material layer 31 mainly contains lead zirconate titanate (PZT) which is a solid solution of lead titanate and lead zirconate and is a ferroelectric material. The piezoelectric material layer 31 is formed continuously to cover the pressure chambers 14. The piezoelectric material layer 31 is formed by an aerosol deposition method (AD method) in which aerosol containing very fine particles and carrier gas is jetted to a substrate to deposit the particles on the substrate. The step for forming the piezoelectric material layer 31 by the AD method will be explained in detail later.

On the upper surface of the piezoelectric material layer 31, the individual electrodes 32 are formed. Each of the individual electrodes has a substantially elliptical plane shape which is a little smaller than the pressure chamber 14. These individual electrodes 32 are formed at positions overlapping with center portions of the corresponding pressure chambers 14 respectively in a plan view. Further, the individual electrodes 32 are made of a conductive material such as gold, copper, silver, palladium, platinum, titanium, or the like. Further, a plurality of contact portions 35 are led out from left end portions in FIG. 2 of the individual electrodes 32. Contacts of a flexible wiring member (not shown) such as a flexible printed circuit (FPC) are joined to the contact portions 35, and the contact portions 35 are electrically connected to a driver IC (not shown) which supplies a driving voltage selectively to the individual electrodes 32 via the wiring member. In the piezoelectric material layer 31, areas 31b overlapping with the individual electrodes 32 are areas deformed by the driving voltage as will be described later, and the areas 31b are referred to as "active portions". FIG. 3 shows an example of the dimension of the pressure chambers 14 (length 0.6 mm, width 0.25 mm) and the dimension of the active portion 31b and the individual electrodes 32 (length 0.5 mm, width 0.16 mm) in the ink-jet head used in this example.

Next, the operation of the piezoelectric actuator 3 at the time when the ink is jetted will be explained. When the driver IC applies the driving voltage selectively to the individual electrodes 32, the individual electrode 32 to which the driving voltage is applied and which is arranged on the upper side of the piezoelectric material layer 31 becomes different in potential from the vibration plate 30 as the common electrode which is kept at the ground potential and which is arranged on a lower side of the piezoelectric material layer 31. Consequently, an electric field in the thickness direction is generated in the piezoelectric material layer 31 sandwiched between the individual electrode 32 and the vibration plate 30. Here, in a case where a polarization direction of the piezoelectric material layer 31 and the direction of the electric field are the same, the piezoelectric material layer 31 expands in the thickness direction, which is its polarization direction, and contracts in a horizontal direction. Then, in accordance with the contraction deformation of the piezoelectric material layer 31, the vibration plate 30 bends to bulge toward the pressure chamber 14 side to decrease the volume of the inside of the pressure chamber 14, and consequently a pressure is applied to the ink in the pressure chamber 14 to cause the jetting nozzle 20 communicating with the pressure chamber 14 to jet ink droplets.

Figure 6A:
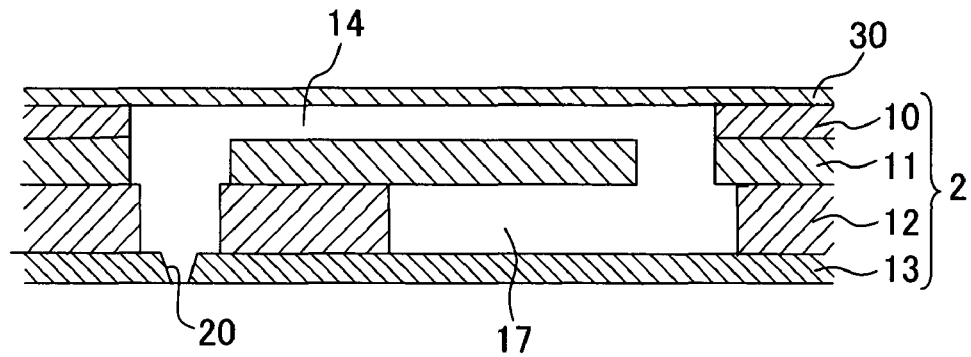
FIGS. 6A to 6C are explanatory views of producing steps of the ink-jet head.
Figure 6B:
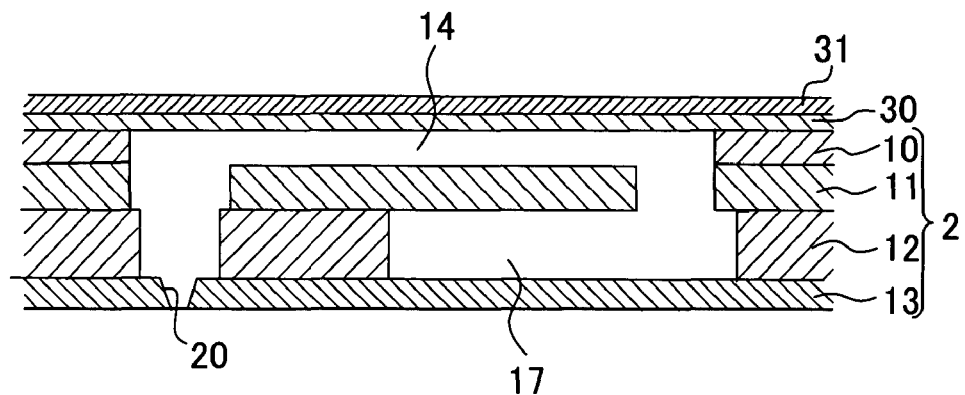
Figure 6C:
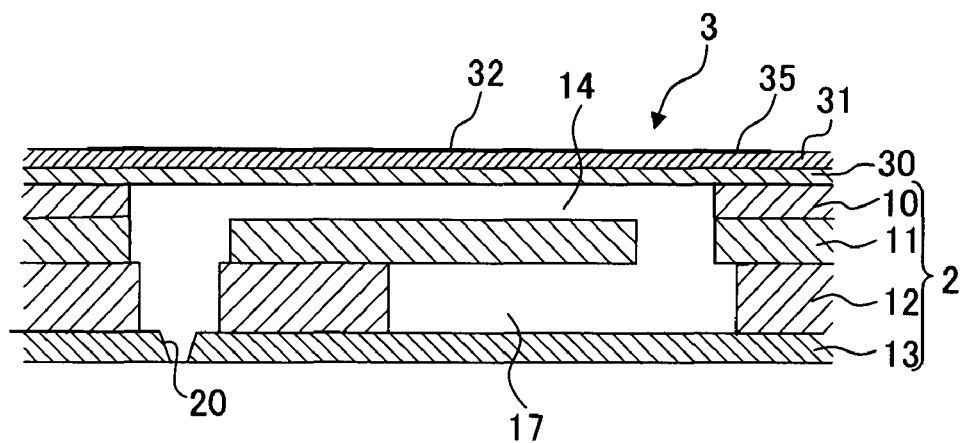

Next, a method for producing the ink-jet head 1 will be explained. FIGS. 6A to 6C schematically show producing steps of the ink-jet head 1. First, as shown in FIG. 6A, the four plates 10 to 13 forming the channel unit 2 and the vibration plate 30 of the piezoelectric actuator 3 are joined together by adhesive bonding, metal diffusion bonding, or the like (step for preparing the substrate).

Next, the piezoelectric actuator 3 is produced by the following steps. As shown in FIG. 6B, the piezoelectric material layer 31 is formed on the upper surface (a surface opposite to a surface joined to the channel unit 2) of the vibration plate 30 by the AD method. Specifically, aerosol containing ultra-fine particles of a piezoelectric material and carrier gas is jetted toward the vibration plate 30 to collide with the vibration plate 30 at high speed, and the particles are densely deposited on the upper surface of the vibration plate 30, thereby forming the piezoelectric material layer 31 in a thin film form. Thereafter, as shown in FIG. 6C, the individual electrodes 32 and the contact portions 35 are formed on the upper surface of the piezoelectric material layer 31 by screen printing, a sputtering method, a deposition method, or the like.

Figure 7:
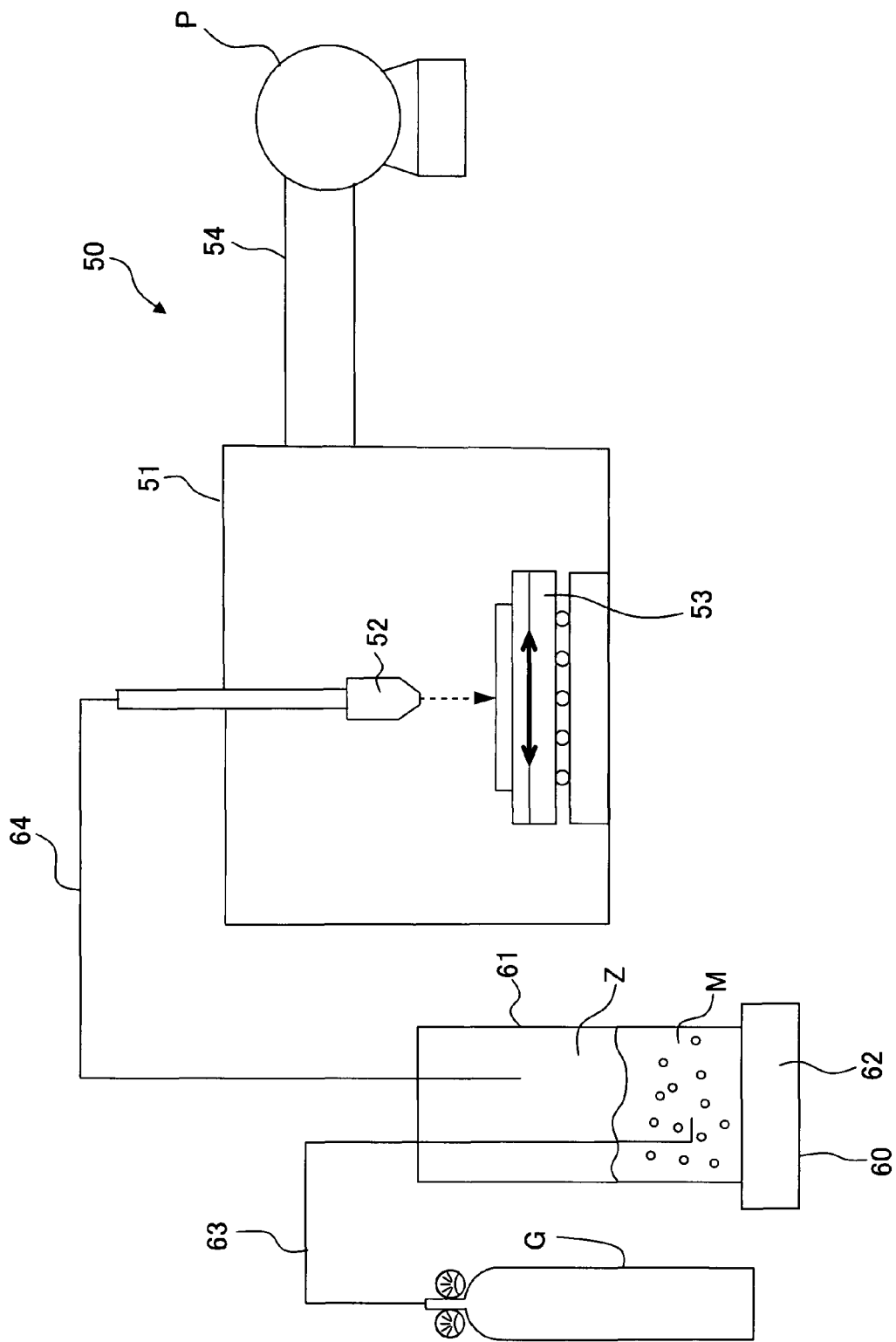
FIG. 7 is a schematic structural view of a film-forming apparatus.

The step for forming the piezoelectric material layer 31 by the AD method will be explained in more detail. FIG. 7 is a schematic structural view of a film-forming apparatus 50 for forming the piezoelectric material layer 31. The film-forming apparatus 50 includes a film-forming chamber 51, a film-forming nozzle 52 connected to an aerosol generator 60 via an aerosol supply pipe 64 and arranged in the film-forming chamber 51, and a stage 53 moving the vibration plate 30 in a predetermined direction in the film-forming chamber 51.

The aerosol generator 60 generates aerosol Z which is a mixture of a piezoelectric material M in an ultra-fine particle form (for example, 1 µm particle size or smaller) and carrier gas. This aerosol generator 60 includes an aerosol chamber 61 which is capable of storing the material particles M therein and a vibrator 62 which is attached to the aerosol chamber 61 to vibrate the aerosol chamber 61. A gas cylinder G for supplying the carrier gas is connected to the aerosol chamber 61 via an inlet pipe 63. As the carrier gas, dry air, nitrogen gas, argon gas, oxygen gas, helium gas, or the like is used. In the film-forming chamber 51, the film-forming nozzle 52 and the stage 53 are arranged, and the film-forming chamber 51 is further connected to a vacuum pump P via an exhaust pipe 54.

The film-forming nozzle 52 has, in a tip portion, a slit 55 (see FIGS. 8A, 8B) which is open toward the vibration plate 30 on the stage 53 and which has a rectangular form long in one direction. Further, the stage 53 moves the vibration plate 30 in a width direction of the slit 55 (horizontal direction in FIG. 7).

In the film-forming apparatus 50, the pressure in the film-forming chamber 51 is lowered by the vacuum pump P, and the vibration plate 30 on the stage 53 is moved relative to the film-forming nozzle 52 while the aerosol generated in the aerosol generator 60 is jetted toward the upper surface of the vibration plate 30 from the slit 55 of the film-forming nozzle 52, thereby forming the piezoelectric material layer 31 on a predetermined area of the vibration plate 30 (step for forming the thin film layer).

Figure 8A:
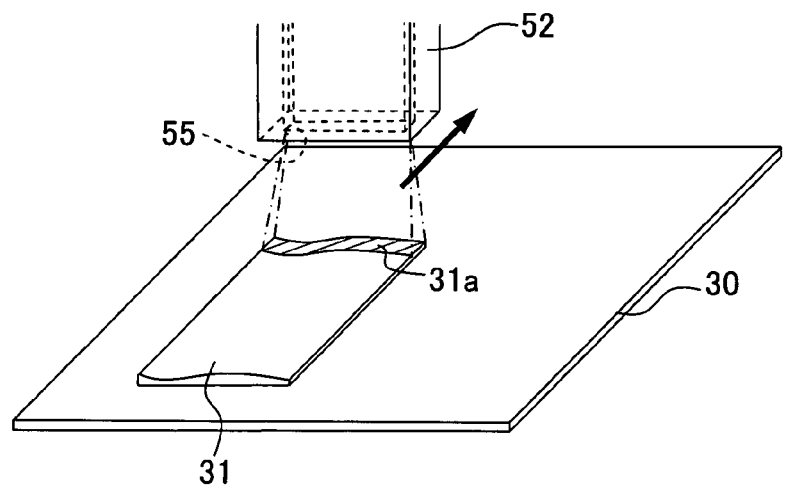
FIG. 8A is a view showing a positional relationship of a vibration plate and a film-forming nozzle in a certain area of the vibration plate when a piezoelectric material layer is formed.
Figure 8B:
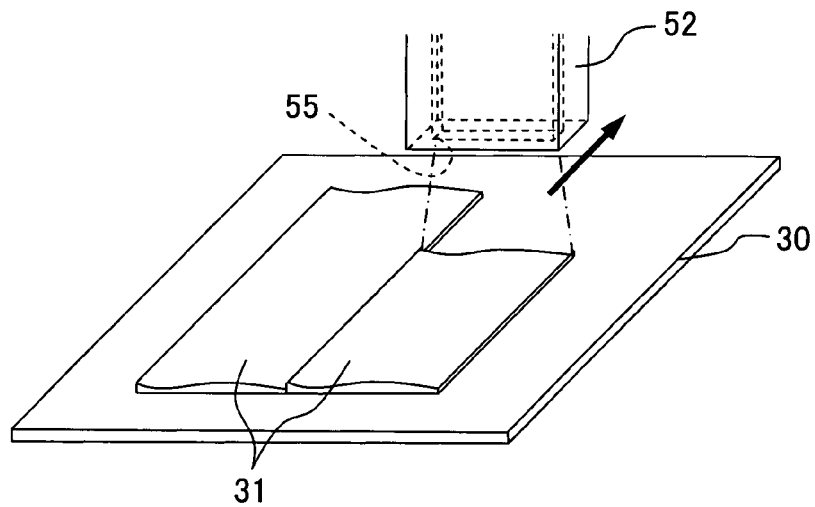
FIG. 8B is a view showing a positional relationship of the vibration plate and the film-forming nozzle in another area of the vibration plate when the piezoelectric material layer is formed.

The relative movement of the vibration plate 30 and the film-forming nozzle 52 when the piezoelectric material layer 31 is formed will be further explained in detail. FIGS. 8A and 8B show the positional relationship between the vibration plate 30 and the film-forming nozzle 52 at the time of the film formation. Actually, the vibration plate 30 moves together with the stage 53 relative to the film-forming nozzle 52 as described above, but in the following explanation, it is assumed, for convenience sake, that the film-forming nozzle 52 moves relative to the vibration plate 30.

Figure 8C:
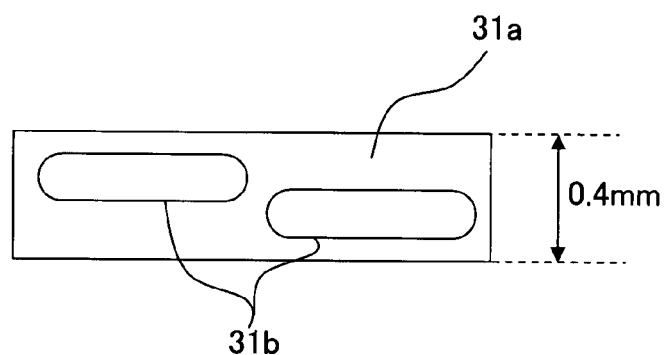
FIG. 8C is a plan view showing a relationship between a jetting area and active portions.

As shown in FIG. 8A, the film-forming nozzle 52 jets the aerosol to the vibration plate 30 while moving in the width direction of the slit 55 (direction orthogonal to the longitudinal direction of the slit 55: front and back direction in FIGS. 8A and 8B) relative to a certain area of the upper surface of the vibration plate 30, thereby forming the piezoelectric material layer 31 on this area. In a case where the piezoelectric material layer 31 needs to be formed on an area other than this area, the film-forming nozzle 52 also jets the aerosol to the other area while similarly moving in the width direction of the slit 55, as shown in FIG. 8B, thereby forming the piezoelectric material layer 31 on this area. Incidentally, the jetting may be stopped until the film-forming nozzle 52 reaches a position above the other area and the jetting may be resumed when the film-forming nozzle 52 reaches a jetting start position of the other area. FIG. 8C shows an area 31a, on the substrate, covered by the aerosol jetted from the film-forming nozzle 52 in a stopped state (hereinafter, referred to as a "jetting area"). In this example, the jetting area 31a is rectangular, has a width of about 0.4 mm, and has a length completely embracing the two active portions 31b arranged in the scanning direction in the piezoelectric material layer 31. Incidentally, the film-forming nozzle 52 which forms the jetting area 31a with a length embracing one active portion 31b or three active portions 31b or more may be used. In this manner, by jetting the aerosol to the areas on the upper surface of the vibration plate 30 while moving the film-forming nozzle 52 relative to these areas, it is possible to form the piezoelectric material layer 31 over a wide area of the upper surface of the vibration plate 30.

Incidentally, in a case where the piezoelectric material layer 31 is formed on each of a plurality of areas on the upper surface of the vibration plate 30, the movement directions of the film-forming nozzle 52 relative to the areas may be the same (from the front side to the back side in FIGS. 8A and 8B), as shown in FIGS. 8A and 8B. Alternatively, in order to enable the continuous jetting of the aerosol to the areas, the movement direction of the film-forming nozzle 52 may be alternately changed in a manner that the film-forming nozzle 52 is moved from the front side to the back side relative to some area and the film-forming nozzle 52 is moved from the back side to the front side relative to an adjacent subsequent area.

When the band-shaped piezoelectric material layer 31 is formed by moving the film-forming nozzle 52 jetting the aerosol, in one direction relative to the vibration plate 30 as shown in FIGS. 8A and 8B, the band-shaped piezoelectric material layer 31 has substantially uniform thickness and scarcely has thickness distribution in the longitudinal direction, namely, the movement direction (the front and back direction in FIGS. 8A and 8B) of the film-forming nozzle 52. On the other hand, in the width direction of the band-shaped piezoelectric material layer 31 (direction orthogonal to the movement direction of the film-forming nozzle 52: the right and left direction in FIGS. 8A and 8B), the piezoelectric material layer 31 easily has thickness distribution because of a reason such as nonuniform velocity distribution of the aerosol jetted from the slit 55.

In the film-forming step of the piezoelectric material layer 31 of this embodiment, as shown by the broken-line arrows in FIG. 9A, the film-forming nozzle 52 is moved relative to the vibration plate 30 in the arrangement direction of the pressure chambers 14 (the arrangement direction of the deformable portions 30a, of the vibration plate 30, corresponding to the pressure chambers 14 respectively) to form the piezoelectric material layer 31 on the upper surface of the vibration plate 30. More concretely, the film-forming nozzle 52 is moved in the arrangement direction of the pressure chambers 14 relative to two areas A1, A2, of the vibration plate 30, which are adjacent in the scanning direction. The area A1 covers two pressure chamber rows on one side in the scanning direction (left side in FIG. 9A) and the area A2 covers two pressure chamber rows on the other side in the scanning direction (right side in FIG. 9A). Specifically, the film-forming nozzle 52 is moved in the arrangement direction of the pressure chambers 14 relative to the area A1, thereby forming the piezoelectric material layer 31, at one time, all over the area A1 covering the left two pressure chamber rows (rows of the deformable portions 30a). Subsequently, the film-forming nozzle 52 is moved in the arrangement direction of the pressure chambers 14 relative to the area A2, thereby forming the piezoelectric material layer 31, at one time, all over the area A2 covering the right two pressure chamber rows. Incidentally, in forming the piezoelectric material layer 31 on the areas A1, A2, the film-forming nozzle 52 may be moved relative to each of the film-forming areas only once, or the film-forming nozzle 52 may be moved relative to one film-forming area a plurality of times to deposit particles in layers As described above, the piezoelectric material layer 31, which is formed by the film-forming nozzle 52 moving in the arrangement direction of the pressure chambers 14, has a substantially uniform thickness in the paper feeding direction which is a direction parallel to the movement direction of the film-forming nozzle 52, as shown in FIG. 9B. On the other hand, as shown in FIG. 9C, in the scanning direction of the ink-jet head 1 which is a direction orthogonal to the movement direction of the film-forming nozzle 52, the piezoelectric material layer 31 has some thickness distribution. Incidentally, if film-forming conditions for forming the piezoelectric material layer 31 on the two areas A1, A2 of the vibration plate 30, such as a movement speed of the film-forming nozzle 52 (that is, a movement speed of the stage 53) and an amount of the aerosol jetted from the slit 55, are the same, these two areas A1, A2 have substantially the same thickness distribution.

Therefore, as shown in FIG. 9C, depending on the thickness distribution of the two areas A1, A2, the thickness of the piezoelectric material layer 31 sometimes changes sharply in a boundary portion B (joint portion) of the areas A1, A2. If a portion, in which the thickness changes sharply, exists in the piezoelectric material layer 31, there is a risk that stress concentration occurs on this portion to break the piezoelectric material layer 31, when the piezoelectric material layer 31 is deformed by the action of the electric field on the piezoelectric material layer 31 due to the application of a predetermined voltage to the individual electrodes 32 at the time of the polarization processing after the film formation or at the time when the jetting pressure is applied to the ink in the pressure chambers 14.

In this embodiment, on the other hand, as shown in FIG. 9A, the film-forming nozzle 52 is moved relative to the vibration plate 30 in the paper feeding direction so that, in a plan view, the boundary portion B of the areas A1, A2 on which the piezoelectric material layer 31 is formed overlap with the restricted portions 30b, of the vibration plate 30, which are joined to the channel unit 2 and which are positioned outside the pressure chambers 14 (deformable portions 30a) and the individual electrodes 32. That is, the boundary portion B of the two areas A1, A2 is positioned between the two center pressure chamber rows and does not overlap with the pressure chambers 14 (deformable portions 30a).

With this structure, even if the thickness of the piezoelectric material layer 31 changes sharply at the boundary portion B of the areas A1, A2, stress concentration occurring on a portion of the piezoelectric material layer 31 corresponding to the boundary portion B is small since the boundary portion B does not overlap with the deformable portions 30a which deform when the electric field is applied to the piezoelectric material layer 31 by the individual electrodes 32. Therefore, the breakage of the piezoelectric material layer 31 is prevented, resulting in enhanced reliability of the piezoelectric actuator 3.

Next, modified embodiments in which the above-described embodiment is variously changed will be explained. Portions having the same structure as those in the above-described embodiment will be assigned the same reference symbols, and explanation thereof will be omitted.

First Modified Embodiment

Figure 10:
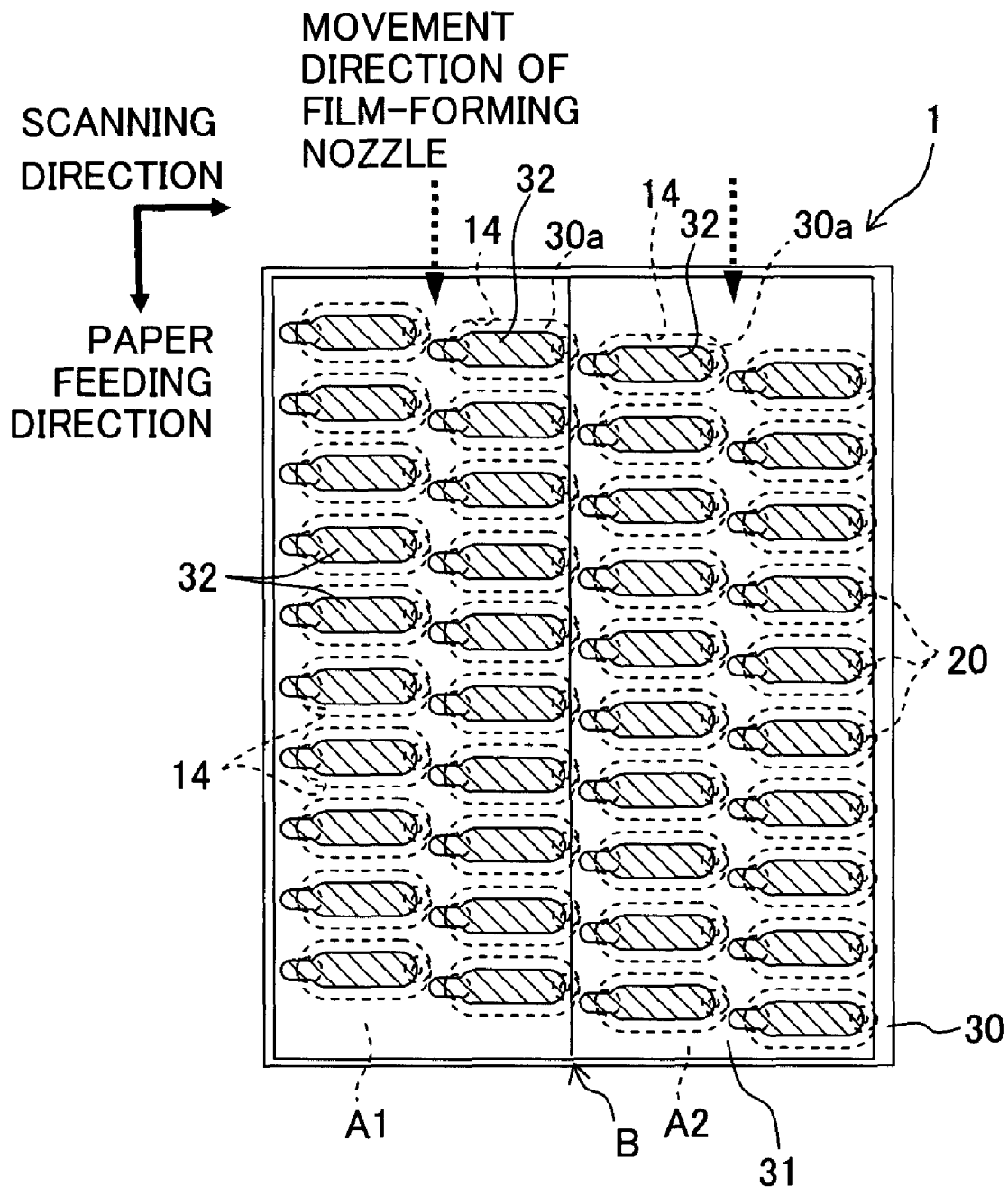
FIG. 10 is a plan view of an ink-jet head according to a first modified embodiment.

When the electric field in the thickness direction acts on the piezoelectric material layer 31 due to the application of the voltage to one of the individual electrodes 32, the deformation of the piezoelectric material layer 31 is largest in portion overlapping with the individual electrode 32 among portions overlapping with the pressure chamber 14. Therefore, as shown in FIG. 10, in a plan view, the boundary portion B of the areas A1, A2 on which the piezoelectric material layer 31 is formed by the relative movement of the film-forming nozzle 52 only has to be positioned outside at least the individual electrodes 32 and may slightly overlap with the pressure chambers 14 (deformable portions 30a). The first modified embodiment can also provide the effect of reducing the stress concentration on the boundary portion B of the areas A1, A2.

Second Modified Embodiment

Figure 11:
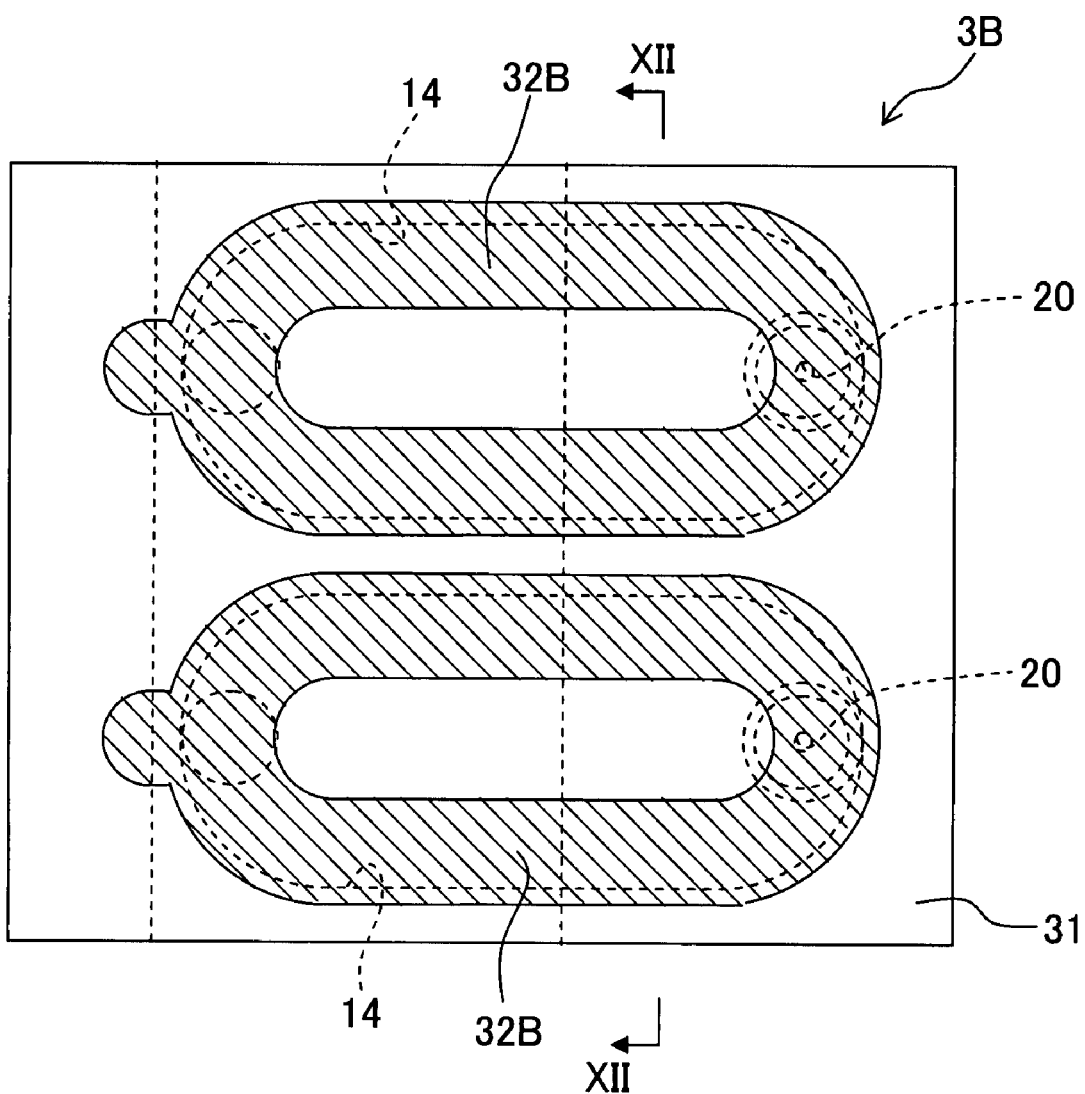
FIG. 11 is a partial enlarged view of an ink-jet head according to a second modified embodiment.
Figure 12:
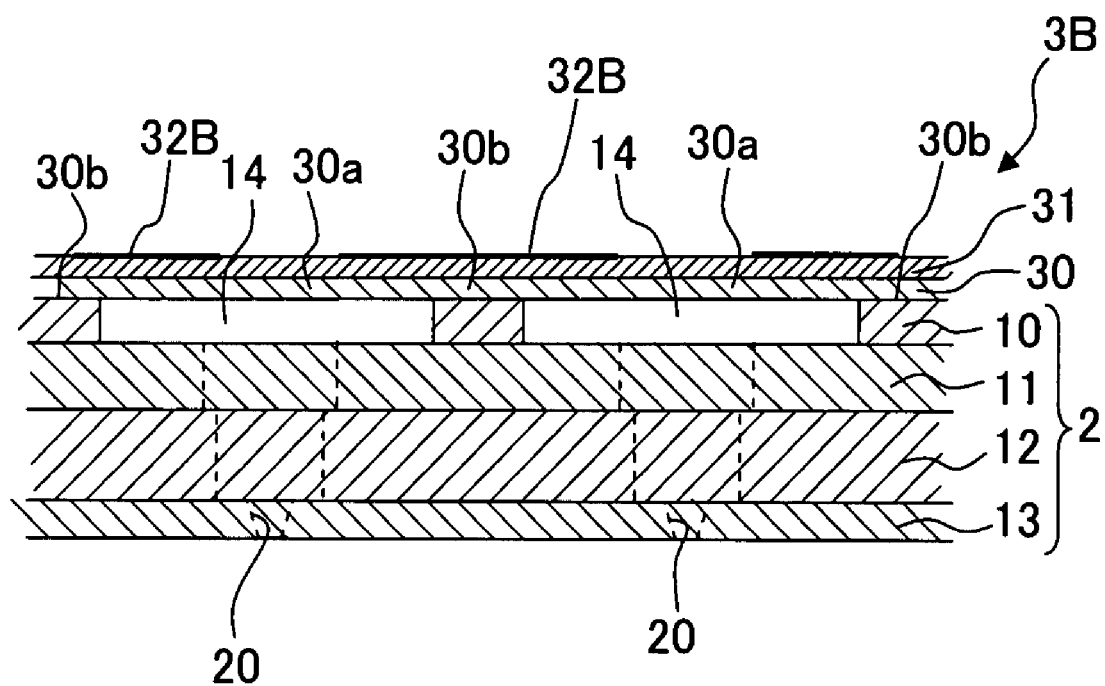
FIG. 12 is a cross-sectional view taken along line XII-XII in FIG. 11.

As shown in FIG. 11 and FIG. 12, in a plan view, individual electrodes 32B of a piezoelectric actuator 3B may be formed in a ring shape along peripheral edges of the pressure chambers 14, in areas overlapping with the pressure chambers 14. In the piezoelectric actuator 3B, when a driving voltage is applied to the individual electrode 32B, the piezoelectric material layer 31 at a portion overlapping with the peripheral edge portion of the pressure chamber 14 makes expansion/contraction deformation to cause the bending deformation of the vibration plate 30. In this manner, the piezoelectric actuator 3B applies a pressure to the ink in the pressure chamber 14. To manufacture such a piezoelectric actuator 3B, the film-forming nozzle 52 is moved so that a boundary of a plurality of areas on which the film is formed by the film-forming nozzle 52 moving relative to the vibration plate 30 is positioned outside the pressure chambers 14.

Further, edges of the individual electrodes 32B and the edges of the pressure chambers 14 may coincide with each other, but to enhance driving efficiency by deforming the piezoelectric material layer 31 in areas right inside the edges of the pressure chambers 14 more greatly, the individual electrodes 32B may be formed to extend up to further outside areas from the edges of the pressure chambers 14 as shown in FIG. 11 and FIG. 12. In this case, the boundary of the areas on which the piezoelectric material layer 31 is formed by the film-forming nozzle 52 moving relative to the vibration plate 30 only has to be positioned outside at least areas, of the individual electrodes 32B, overlapping with the pressure chambers 14 (deformable portions 30a) (that is, at least the edges of the pressure chambers 14), and may overlap with portions, of the individual electrodes 32B, positioned outside the pressure chambers 14.

Third Modified Embodiment

Figure 13A:
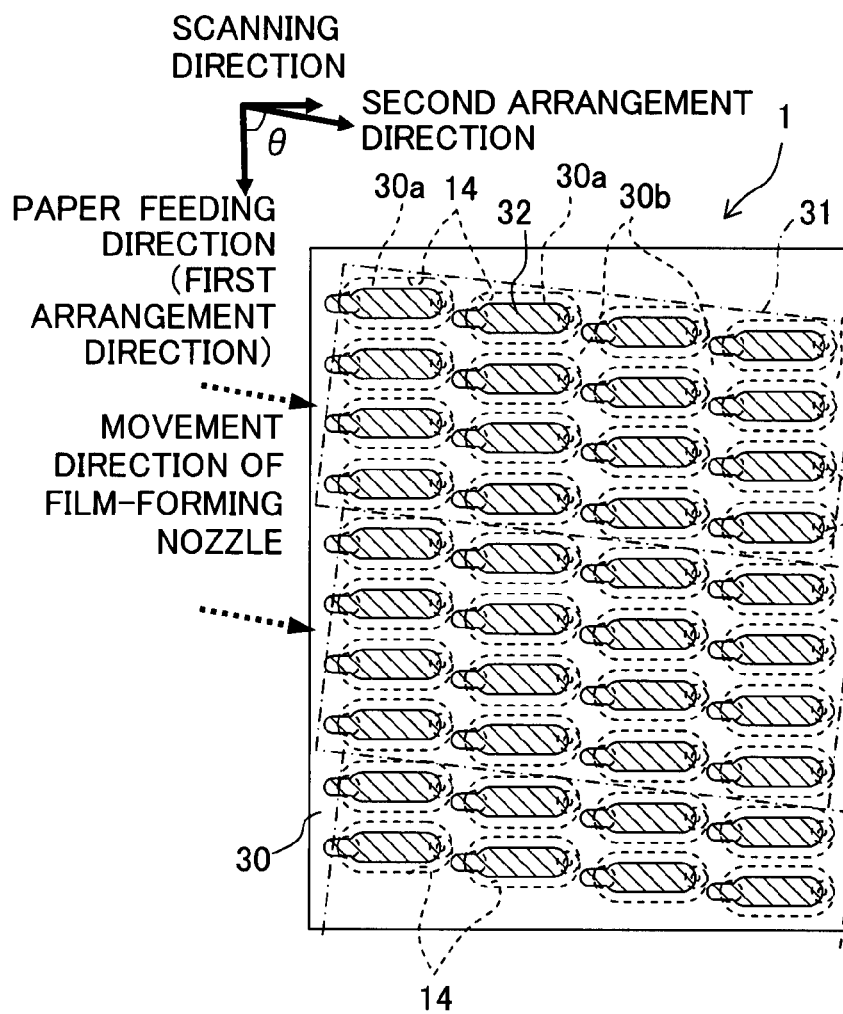
FIG. 13A is a plan view of an ink-jet head according to a third modified embodiment.
Figure 13B:
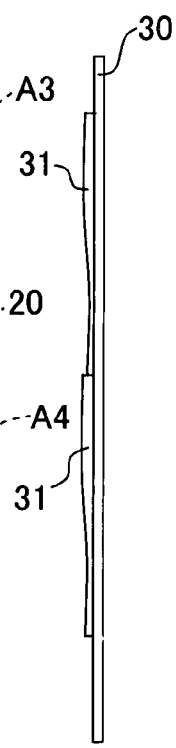
FIG. 13B is a side view of a piezoelectric actuator according to the third modified embodiment seen from a scanning direction.

As shown in FIG. 13A, the pressure chambers 14 are arranged in a matrix form along the two directions, that is, the paper feeding direction (first arrangement direction) and the direction inclined to the paper feeding direction at the angle θ (second arrangement direction). Here, the film-forming nozzle 52 may be moved in the second arrangement direction relative to the vibration plate 30, thereby forming the piezoelectric material layer 31 at one time on an area, of the vibration plate 30, covering one row or a plurality of rows of the pressure chambers 14 (deformable portions 30a) arranged in the second arrangement direction. In this case, the piezoelectric material layer 31 sometimes has thickness distribution as shown in FIG. 13B to have a sharp thickness change in a boundary portion of film-formed areas A3, A4. However, by moving the film-forming nozzle 52 so that the boundary of the film-formed areas A3, A4 is positioned between the pressure chamber rows, it is possible to reduce the stress concentration on the boundary portion.

Fourth Modified Embodiment

In the above-described embodiment, the piezoelectric material layer 31 which is one of the thin film layers constructing the piezoelectric actuator 3 is formed by the AD method, but a thin film layer other than the piezoelectric material layer 31 may be formed by the AD method. For example, a structure shown in FIG. 14 has an advantage that wirings for supplying the driving voltage to the individual electrodes 32 can be easily arranged on the upper surface of the vibration plate 30. In this structure, the individual electrodes 32 are arranged on the upper surface of the vibration plate 30 (lower surface of the piezoelectric material layer 31), and a common electrode 34 is arranged on the upper surface of the piezoelectric material layer 31 to face the individual electrodes 32 in common. However, in a case where the vibration plate 30 is a conductive metal plate in this structure, it is necessary to provide an insulation layer 36 between the vibration plate 30 and the individual electrodes 32 so as to insulate the both from each other. The insulation layer 36 needs to have a certain degree of rigidity similarly to the vibration plate 30 in order to surely transmit the deformation of the piezoelectric material layer 31 to the ink in the pressure chambers 14. For example, the insulation layer 36 is made of an insulative ceramic material such as alumina or zirconia.

The insulation layer 36 made of the ceramic material such as alumina can be formed by the AD method as in the film-forming step of the piezoelectric material layer 31 previously described. Specifically, while the film-forming nozzle 52 having the slit 55 is moved in a predetermined direction relative to the vibration plate 30, aerosol containing fine particles of the ceramic material forming the insulation layer 36 and carrier gas is jetted onto the vibration plate 30 from the slit 55 of the film-forming nozzle 52 (see FIGS. 8A and 8B), thereby forming the insulation layer 36. At this time, as in the above-described embodiment, the film-forming nozzle 52 is moved so that boundaries of a plurality of areas on which the film is formed by the film-forming nozzle 52 moving relative to the vibration plate 30 are positioned outside the areas, of the individual electrodes 32, overlapping with the pressure chambers 14 (deformable portions 30*a*).

In the fourth modified embodiment, both of the insulation layer 36 and the piezoelectric material layer 31 may be formed by the above-described film-forming step using the AD method, or the piezoelectric material layer 31 may be formed by a method other than the AD method.

The embodiment and modified embodiments explained above are examples where the present invention is applied to the piezoelectric actuator for ink-jet head, but forms to which the present invention is applicable are not limited to these. That is, the present invention is also applicable to a piezoelectric actuator used in a field other than a field of the ink-jet head, provided that it is structured to drive a driven object by deforming deformable portions of a substrate. The liquid droplet jetting apparatus is applicable not only to the ink-jet printer but also to apparatuses jetting liquid droplets, used in various fields such as a medical field and an analysis field.

What is claimed is:

1. A piezoelectric actuator, comprising:
a substrate having a plurality of deformable portion rows each having deformable portions arranged in a row and restricted portions defining the deformable portions; and
a plurality of thin film layers which are disposed on the substrate and which include a piezoelectric material layer and driving electrodes arranged on one surface of the piezoelectric material layer, each of the driving electrodes overlapping at least partially with one of the deformable portions;
wherein at least one thin film layer among the thin film layers has a plurality of areas adjacent to each other, each of the areas overlaps with at least one of the deformable portion rows, and a boundary portion of the adjacent areas is positioned outside each of the deformable portions; and
wherein each of the areas and the boundary portion continuously extends in one direction, each of the areas having uniform thickness in the one direction and having thickness distribution in a direction orthogonal to the one direction.

2. The piezoelectric actuator according to claim 1;
wherein the at least one thin film layer is the piezoelectric material layer.

3. The piezoelectric actuator according to claim 1;
wherein the at least one thin film layer is formed on each of the defined areas adjacent on the substrate by jetting, to the areas, aerosol which contains particles forming the at least one thin film layer and carrier gas from a film-forming nozzle while moving the film-forming nozzle relative to each of the defined areas so that a boundary portion of the adjacent areas is positioned outside the deformable portions.

4. A liquid droplet jetting apparatus, comprising:
a channel unit having a plurality of pressure chamber rows each having pressure chambers arranged along a plane and a plurality of jetting nozzles communicating with the pressure chambers respectively; and
a piezoelectric actuator including:
a substrate which is disposed on one surface of the channel unit to cover the pressure chambers, and which has a plurality of deformable portion rows each having deformable portions arranged in a row and facing the pressure chambers and restricted portions, at which the piezoelectric actuator is joined to the channel unit; and
a plurality of thin film layers which are disposed on the substrate, and which include a piezoelectric material layer and driving electrodes, the driving electrodes being arranged on one surface of the piezoelectric material layer to overlap with the deformable portions respectively;
wherein at least one thin film layer among the thin film layers of the piezoelectric actuator has a plurality of areas adjacent to each other, each of the areas overlaps with at least one of the deformable portion rows, and a boundary portion of the adjacent areas is positioned outside each of the deformable portions; and
wherein each of the areas and the boundary portion continuously extends in one direction, each of the areas having uniform thickness in the one direction and having thickness distribution in a direction orthogonal to the one direction.

5. The liquid droplet jetting apparatus according to claim 4;
wherein the at least one thin film layer is the piezoelectric material layer.

6. The liquid droplet jetting apparatus according to claim 4;
wherein at least one thin film layer is formed on the adjacent areas on the substrate, by jetting, to the areas, aerosol which contains particles forming the at least one thin film layer and carrier gas from a film-forming nozzle while moving the film-forming nozzle relative to each of the adjacent areas so that a boundary portion of the adjacent areas is positioned outside the deformable portions.

7. The liquid droplet jetting apparatus according to claim 4, which is an ink-jet printer.

* * * * *